United States Patent
Shum

[19]

[11] Patent Number: 5,883,748
[45] Date of Patent: Mar. 16, 1999

[54] OPTICAL SYSTEM TO ACHIEVE ENHANCED COUPLING EFFICIENCY OF A LIGHT BEAM INTO AN OPTICAL TRANSMISSION MEDIUM

[76] Inventor: Frank T. C. Shum, 1531 Oriole Dr., Sunnyvale, Calif. 94087

[21] Appl. No.: 901,814

[22] Filed: Jul. 28, 1997

Related U.S. Application Data

[62] Division of Ser. No. 513,695, Aug. 11, 1995.

[51] Int. Cl.$^6$ ............................... G02B 7/02; G02B 6/38; G02B 6/36
[52] U.S. Cl. ............................. 359/819; 385/92; 385/93; 385/61
[58] Field of Search ....................................... 359/216, 217, 359/218, 219, 672, 673, 674, 675, 721, 822, 618, 879; 385/28, 60, 72, 77, 98, 104, 92, 93, 61

[56] References Cited

U.S. PATENT DOCUMENTS

| | | | |
|---|---|---|---|
| 3,551,029 | 12/1970 | Kirchhoff | 359/209 |
| 4,273,410 | 6/1981 | Menke | 359/669 |
| 4,932,732 | 6/1990 | Nakajima | 359/210 |
| 5,351,330 | 9/1994 | Jongewaard | 385/93 |
| 5,500,911 | 3/1996 | Roff | 385/33 |
| 5,515,206 | 5/1996 | Peng | 359/721 |
| 5,528,416 | 6/1996 | Hartmann | 359/381 |
| 5,745,621 | 4/1998 | Musk | 385/72 |

*Primary Examiner*—Georgia Epps
*Assistant Examiner*—Ricky Mack
*Attorney, Agent, or Firm*—W. Douglas Carothers, Jr.

[57] ABSTRACT

An optical system for coupling an output beam in an alignment direction from a semiconductor device output beam from a semiconductor device through a lens arrangement to focus the beam onto a center point of an input end surface of an optical transmission medium. The optical system includes a steering lens positioned between the semiconductor device and a focusing lens with the center of the steering lens in relative axial alignment with the output beam and may be laterally translated in a direction transverse to the axial direction of said beam for initially aligning the focused point of said beam in close proximity to said center point. Moreover, the steering lens may be rotated about either or both axis of rotation in a plane transverse to the axial direction of the output beam to further translate the angle of output beam onto the center point of the input end the optical transmission medium for precise alignment of the focused point of the beam as well as obtain maximum coupling efficiency of the beam into the medium.

17 Claims, 4 Drawing Sheets

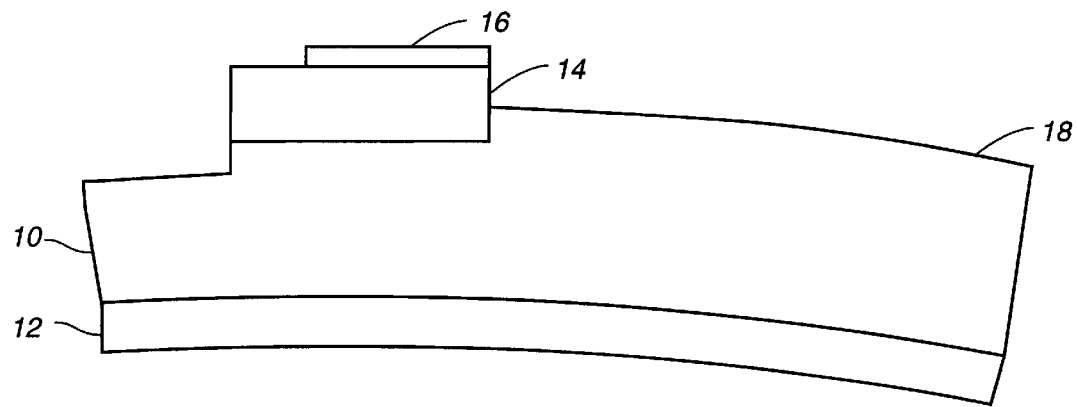
FIG._1
*(PRIOR ART)*
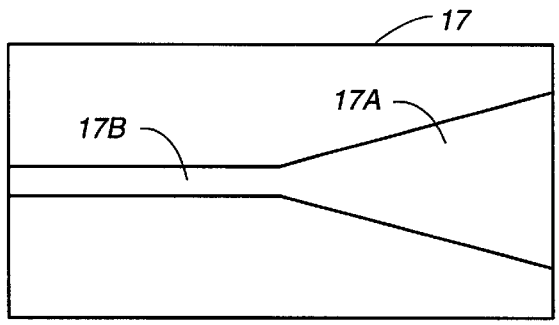
FIG._1A
*(PRIOR ART)*
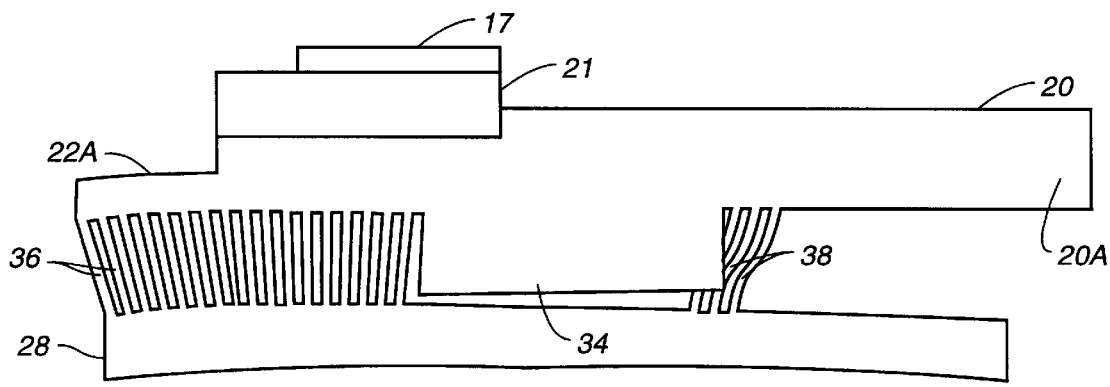
FIG._5

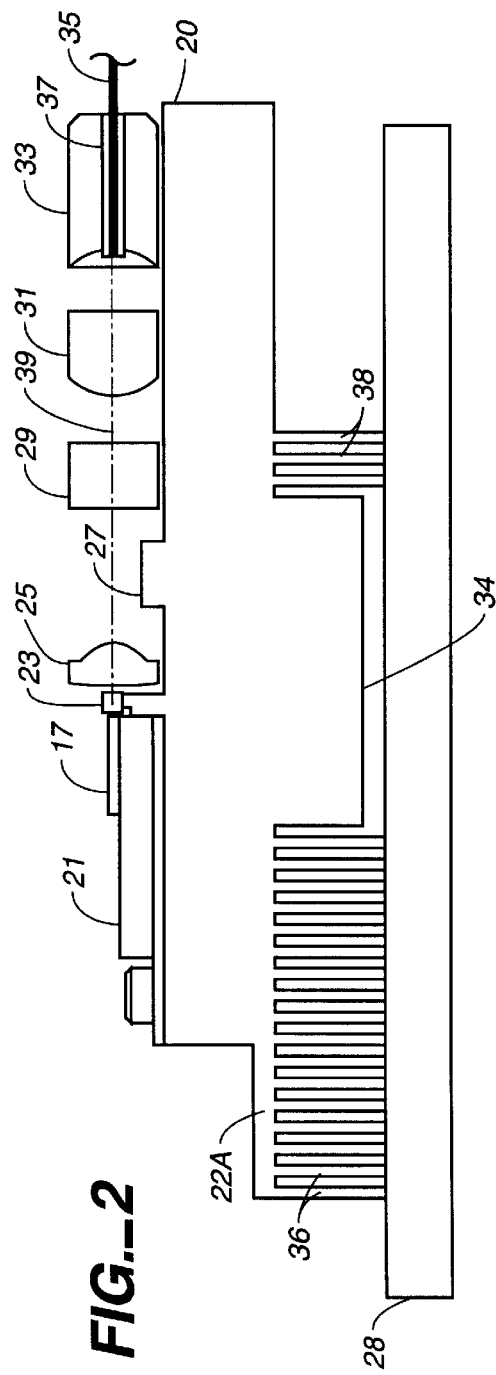
FIG._2
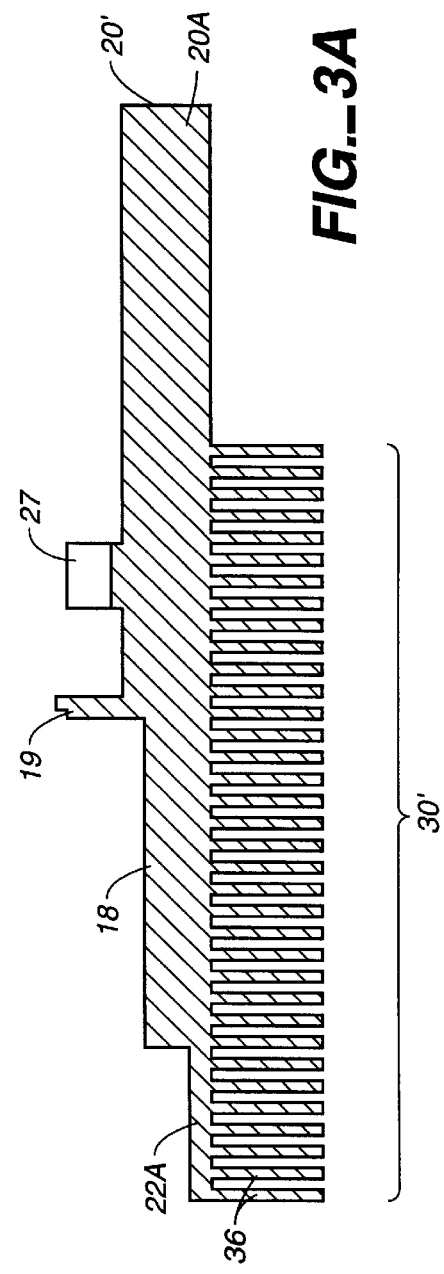
FIG._3A

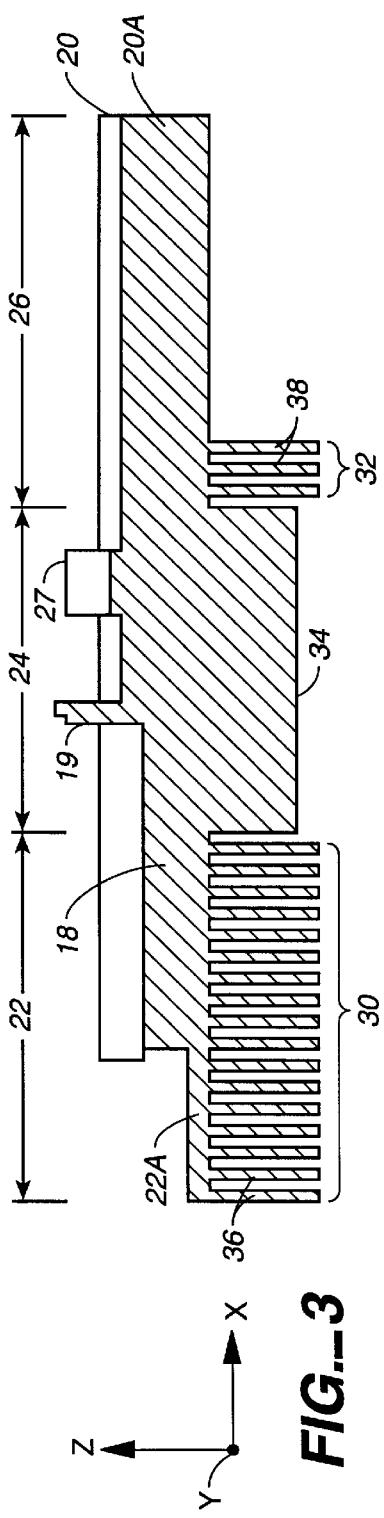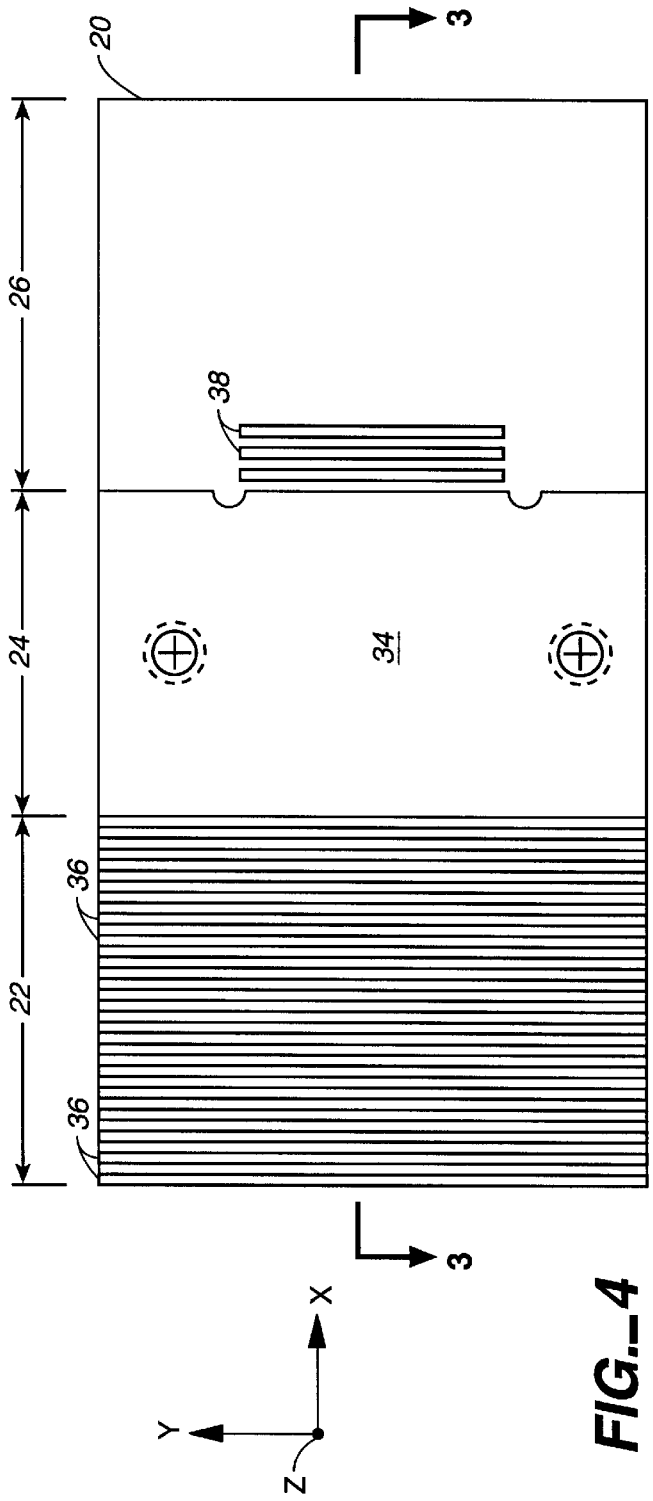

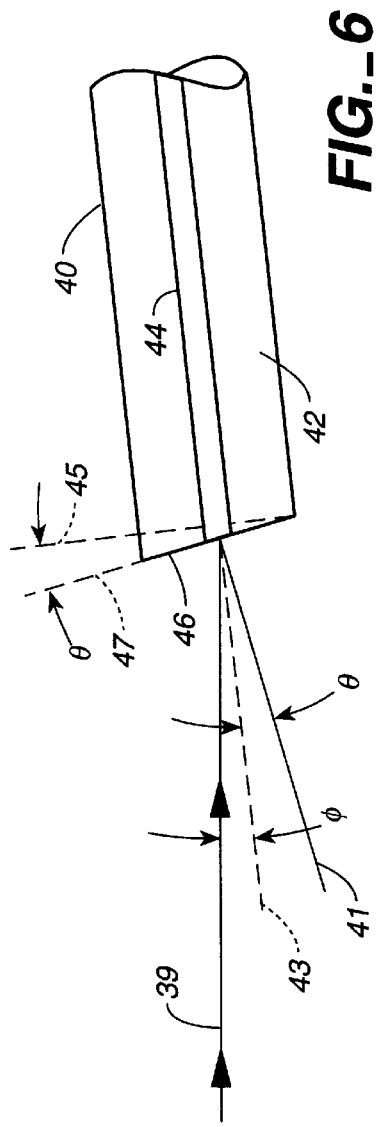
FIG._6
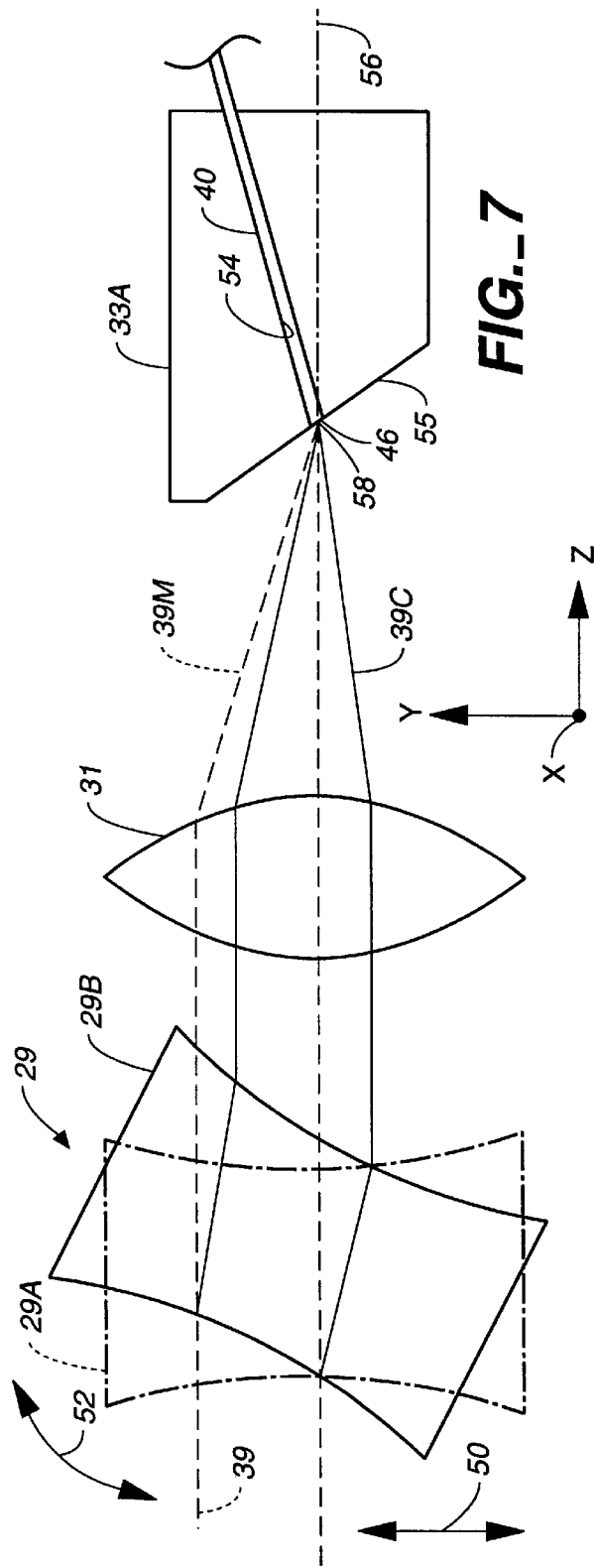
FIG._7

1

OPTICAL SYSTEM TO ACHIEVE ENHANCED COUPLING EFFICIENCY OF A LIGHT BEAM INTO AN OPTICAL TRANSMISSION MEDIUM

REFERENCE TO A RELATED APPLICATION

This application is division of patent application Ser. No. 08/513,695, filed Aug. 11, 1995, and entitled "LOW STRESS HEATSINK AND OPTICAL SYSTEM"

BACKGROUND OF THE INVENTION

The present invention relates to an optical system for alignment of such with associated electrical and optical components.

Many devices, including semiconductor devices or other such similar electrical or electronic components, require heatsinking and cooling due to their high level generation of heat during their operation. If not properly dissipated, the generated heat may adversely affect the resulting operating conditions of the device as well as affect the prealignment of optical components in the device.

Heat dissipating devices, such as semiconductor light sources, laser diodes, MOPA devices, laser diode arrays, single or multiple laser bars, optical transceivers or optical integrated circuits, semiconductor chips or other integrated circuit chips, hereinafter collectively referred to as "semiconductor device(s)", are being designed at increasingly larger power levels so that, without adequate cooling of these devices during their operation, they would self-destruct in a relatively short period of time. Presently, the cooling is effectively carried by mounting the laser diode package on a heatsink which is mounted on a microchannel fluid cooler or on an thermal electric cooler. An example of the former is shown in U.S. Pat. No. 5,107,091 and an example of the latter is shown in U.S. Pat. No. 5,270,869. While these heat dissipation techniques provide for increased efficient means of carrying away heat dissipated from these devices, there is a problem of bulkiness of the cooler for modern applications of these devices as well as subsequent misalignment of the mounted semiconductor device relative to associated electrical and optical components, such as lenses, waveplates, optical fibers, which are initially aligned in proper axial alignment with the output provided from the semiconductor device. Over time, misalignment can occur due to warpage of the heatsink supporting the semiconductor device.

As indicated above, one of the present key technologies in semiconductor device packaging is the employment of a heatsink upon which the semiconductor device and its associated submount is mounted, and the mounting of the heatsink directly onto a thermal electric cooler. A specific example of a typical small package configuration is the employment of a copper heatsink in the form of a copper bar soldered directly to a ceramic thermal electric cooler. However, as the package configuration increases due to larger semiconductor devices in both physical size and power requirements, the package size correspondingly increases resulting in larger mismatches in thermal expansion between copper and ceramic materials. The consequence is that substantial stress deflection and warpage of the heatsink causes potential separation of the heatsink from the cooler. Also, even without separation, warpage occurs resulting in misalignment of the initially preset alignment of the semiconductor device with its associated electrical and optical components. Also, the stress cause by the thermal mismatch of materials due to their different thermal coefficients may result in catastrophic failure of the thermal electric cooler.

A particular example of heat dissipation resulting in substantial heatsink stress deflection is in connection with a fiber coupled MOPA device mounted on a copper heatsink block soldered to a ceramic thermal cooler. An example of such a product is the 1 watt CW single mode MOPA laser diode, SDL-5762 package, manufactured and sold by SDL, Inc., the assignee herein. Heatsinking in such a package can be of considerable concern because of the significant size of the required cooler, e.g., 1" by 2". Submicron alignment tolerances of aligned components in the package (whether such components may be mounted partly on or off the heatsink), with the output provided from the MOPA device are apt to become significantly misaligned due to heatsink stress deflection caused by thermal expansion differences between the copper heatsink and the ceramic cooler. This stress deflection is illustrated in FIG. 1 showing a computer simulation of a solid copper heatsink block 10 soldered to a 3 mm thick ceramic plate 12 of the type employed relative to a thermal electric cooler. MOPA device 16 is shown mounted on copper submount 14 which, in turn, is mounted on heatsink block 10. As shown in FIG. 1, when heatsink block 10 is heated, there results significant bowing and warpage of heatsink block 10 due to the differences in thermal transfer coefficients of copper block 10 and ceramic plate 12. A few degrees change in temperature will cause substantial misalignment. The resulting stress deflection of heatsink 10, particularly as shown the forward end 18 of the heatsink, for example, may be several microns. This amount of stress deflection would result in substantial misalignment of the output of MOPA device 16 with associated aligned components, such as an input end of an aligned optical fiber, which is entirely unacceptable.

It is an object of this invention to provide an optical system for alignment of electrical and optical components relative to a heatsink so that precision alignment with maximum coupling efficiency to a optical transmission medium is achieved.

Disclosures of the Invention

According to this invention optical system alignment of electrical and optical components relative to the output of a semiconductor device is provided to achieve maximum coupling efficiency of the output to an input of an optical transmission medium, such as an optical fiber or optical waveguide. Such components may be, in part, mounted on the low stress heatsink of this invention to reliably ensure their continued alignment after their initial set alignment. The optical system provides for coupling an output beam from a semiconductor device through a lens arrangement to focus the beam onto a center point of an input end of an optical transmission medium. The optical system includes a focusing lens positioned between the semiconductor device and the optical transmission medium to receive its output, such as a light beam, for focusing the beam to the input end center point. The optical system includes a steering lens positioned between the semiconductor device and the focusing lens with the center of the steering lens in relative axial alignment with the output beam and may be laterally translated in a direction transverse to the axial direction of said beam for initially aligning the focused point of said beam in close proximity to said center point. Moreover, the steering lens may be rotated about either or both axis of rotation in a plane transverse to the axial direction of the output beam to further translate the angle of output beam onto the center point of the input end the optical transmission medium for precise alignment of the focused point of the beam as well as obtain maximum coupling efficiency of the beam into the medium.

Of particular importance is where the semiconductor device is a stable or unstable resonator having a resonator portion with a lateral dimension which is larger at its output, such as comprising a light beam, than some other portion of the resonator and is usually provide with an antireflection coating at the output. An example of such a device is a flared device, such as MOPA device. As a result, any portion of the output of such a semiconductor device fed back through its output will affect the stability of operation and its desired operating characteristics, such as its operating wavelength. Such reflected feedback can be from the input end of an optical transmission medium in axial alignment with the device output beam. A support, such as a cylindrically shaped ferrule, is provided for supporting the optical transmission medium at a angle transverse to the axial direction of the output beam so that the beam is at an angle for optical input into the transmission medium. The support is designed so that the central axis of the supporting means is aligned with the axial direction of the output beam. A center point of the input end of the transmission medium fixed in the support so that the input end of the optical transmission medium is positioned substantially on the central axis of the support. In this manner, no reflected feedback to the device is possible and alignment of the support is made easy even though the input end of the optical transmission medium is not in direct axial alignment with the device output beam.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a schematic diagram of a computer thermal deflection simulation of the thermal stress results of a prior art heatsink configuration.

FIG. 1A is a planar view of an example of a semiconductor device in the form of a MOPA device that may be employed with the heatsink comprising this invention.

FIG. 2 is a side elevation of a low stress heatsink comprising this invention with a mounted semiconductor device in pre-aligned relation with associated electrical and optical components as mounted on the heatsink.

FIG. 3 is a cross sectional view of the heatsink shown in FIG. 2 taken along the line 3—3 in FIG. 4.

FIG. 3A is a cross sectional view of another embodiment of the heatsink comprising this invention.

FIG. 4 is a bottom view of the heatsink shown in FIG. 3.

FIG. 5 is a schematic diagram of a computer thermal deflection simulation of the thermal stress results of the heatsink configuration comprising this invention.

FIG. 6 is a schematic illustration of alignment considerations relative to certain lens system configurations of this invention with particular attention to prevention of feedback to the semiconductor device source.

FIG. 7 is a schematic illustration of alignment considerations relative to alignment of the semiconductor device output relative to the lens system of this invention in achieving center point alignment of the output on an optically coupled transmission medium.

DETAILED DESCRIPTION OF THE PREFERRED EMBODIMENT OF THE INVENTION

As used throughout the description, the term "semiconductor device" is intended to include any heat generating and dissipating device or other such electrical or electronic component that requires some assistance in dissipated heat removal in order that the device will properly function under its normal operating conditions. Such devices include, but not limited to, light sources, laser diodes, flared device, MOPA devices, laser diode arrays, single or multiple laser bars, optical transceivers, optical integrated circuits, semiconductor chips or other integrated circuit chips.

As semiconductor devices with large heat generating capacity increasing become larger in size, they are undesirably subjected to additional thermal stain and stress, such as mechanical deflection, bending or bowing, due to temperature changes. In other words, the longer these chips become, the more tendency for them to bend under increased temperatures due to the same bending conditions imposed upon the underlying heatsink which supports the semiconductor device. Therefore, there is need to consider a heatsink configuration that will efficiently transfer heat away from the semiconductor design to an underlying support while not itself bowing or bending due to temperature changes and thermal mismatch between itself the semiconductor submount or the underlying support surface, such as a thermal electric cooler. An example of one such device is a flared optical amplifier or laser diode device or a MOPA (master oscillator power amplifier) device. An example of such MOPA devices are shown in U.S. Pat. No. 5,537,432, issued Jul. 16, 1996, owned by the assignee herein, and is illustrated in FIG. 1A. Semiconductor device 17 comprises a MOPA resonator having a flared or tapered gain region 17A coupled with a single mode oscillator region 17B. In the case where region 17B is not an oscillator, region 17B functions as a selective mode filter for propagating light that, upon entering flared gain region 17A, propagates with a diverging phase front. The length of these devices have now reached 3 mm which is comparatively much larger than laser diode devices that may have a length, for example, around 500 $\mu$m. These devices have a laterally, enlarged gain region which generally have a flared configuration, but can be of any other geometric enlarged region, so that the generic criteria for these type of devices with such enlarged gain regions may be defined as a stable or unstable resonator having a resonator portion with a lateral dimension which is larger at its output than some other portion of the resonator. Any bending or bowing of these larger devices, due to large temperature changes occurring in the packaged mount and support system, will materially affect the device's operating characteristics, in particular, the enlarged gain region will be subjected to filamentation in its output so the resulting output beam will not contain its originally designed, uniform intensity profile.

Moreover, if there are associated electrical and optical components supported, at least in part, on a common heatsink with the semiconductor device and in initially aligned relation with the semiconductor device, these components may also easily become misaligned due to temperature changes causing the underlying heatsink to bend or bow which is translated to its mounting surface where these components as well as the semiconductor device are mounted.

Thus, the heatsink of this invention provides a heatsink body portion for mounting the semiconductor device and associated components that are not substantially subjected to these types of thermal strain and stress preventing the occurrence of both deterioration in the operation of the semiconductor device and material misalignment of the device relative to associated components.

With reference to FIG. 2, there is shown heatsink 20 comprising this invention which will be explained in greater detail later in reference to FIGS. 3–5. Heatsink 20 has a bulk body portion provided with a segmented leg design, and may be comprised of a copper block, or diamond material, or a diamond faceplate formed on a copper base to provide for low thermal resistance and good heat transfer characteristics. Heatsink 20, via legs 36 and 38, is mounted on the upper surface of a ceramic thermal electric cooler 28, which is conventionally accomplished by means of solder. To be noted is that the ends of legs 36 and 38 support heatsink 20 on the surface of cooler 28 in a manner that the undersurface of heatsink belly portion 34 does not engage or contact the surface of cooler 28.

Heatsink 20 includes a recess 18 (FIG. 3) for receiving and supporting a semiconductor device 17 mounted on submount 21. Submount 21 may be a copper, or diamond material, or a diamond faceplate on a copper submount. Submount 21 is then mounted into recess 18 and secured into position in a conventional manner. The contour of the upper surface of heatsink 20 is designed so as to accommodate the output of semiconductor device, for example an optical beam output, for accurate pre-set aligned relation with a plurality of other electrical and optical components, as exemplified by alignment axis 39. The illustration of the components in FIG. 2 is just one of many different examples for coupling the output of device 17 as input to another device, such as optical fiber 35. These components are shown supported directly on heatsink 20, but, as is known to those skilled in this art, some or all of these components could be mounted in other ways and not necessarily on the surface of heatsink 20. Cylinder micro lens 23 is supported on heatsink post support 19 and functions with collimator lens 25 to equalize the orthogonal divergence of the output beam of device 17 so that it is symmetrical in orthogonal directions. The output of some semiconductor devices may be astigmatic so that lenses 23, 25 provide an astigmatic correcting lens system as explained in U.S. Pat. No. 5,321,718, in particular at FIGS. 11 and 12 therein, which patent is commonly owned by the assignee herein and is incorporated herein by reference thereto. The output beam then passes through collimator lens 25 and is directed through steering lens 29 and focusing lens 31. Steering lens 29 aids to make final alignment adjustments of the output beam to be properly aligned with the focal axis of lens 31. Mount 27 is for receipt of an optical isolator, if necessary, to prevent any possible optical feedback of a portion of the output beam from device 17. Fiber ferrule 33 is also supported on heatsink 20 and has a central bore 37 for receiving and securing therein the input end of optical fiber 35.

With reference to FIGS. 3 and 4, heatsink 20 comprises a solid body or member having three principal sections or portions comprising body portions 22, 24 and 26. The underside of body portion 22 contains a first leg structure 30 comprising a plurality of legs 36. Legs 36 may be comprised of various different kinds of geometric shapes, such as, fins, columns or post members. They need not be of all identical geometry or shape as long as they are sufficient in number to provide for good heat transfer characteristics and concurrently capable of sufficiently taking up and absorbing developed thermal stress deflections imposed upon heatsink 20. The preferred design includes a group of closely spaced, elongated fins 36 that extend for the substantial width in the y direction of heatsink 20, as best seen in FIG. 4. As can be seen in FIGS. 3 and 4, the spacing between fins 36 is about the same in width as the thickness of a fin 36. One reason for the small spacing is to insure sufficient number of fins for high heat transfer capacity to the underlying surface, such as cooler 28. Fins 36 also extend rearwardly of the main body portion 20A of heatsink 20, as indicated at 22A. This type of geometry provides for maximum surface contract via the ends of fins 36 for thermal transfer exchange with the ceramic surface of cooler 28. Therefore, the large surface fins 36 are designed to provide for rigid support of heatsink 20 and maximize efficient transfer of heat to cooler 28. Also, fins 36 are directionally transverse to the longitudinal direction of significant warpage magnitude, as illustrated at 18 in FIG. 1, to provide some resistance to the tendency of this warpage as well as physically absorb the warpage within the fin structure itself.

Body portion 26 at the forward end of heatsink 20 includes a thin body extension 22B having an undersurface with a second leg structure 32 which comprises at least one leg 38. Again, legs 38 may be comprised of various different kinds of geometric shapes, such as fins, columns or post members or combinations thereof. The preferred design for structure 32 is several fins 38. Three such fins 38 are shown in FIGS. 2 and 3 but since the purpose of fins 38 is to provide the second of two supports (the first support being leg structure 30) for heatsink 20 on the surface of cooler 28, one fin may be sufficient to provide adequate support, prevent vibration of the heatsink, and absorb any thermal stress deflection. As can be seen in FIGS. 3 and 4, the spacing between fins 38 is about the same in width as the thickness of a fin 38.

As best seen in FIG. 4, fins 38 are of substantially smaller width in the y direction compared to fins 36. Their smaller size is because they are not required to be as extensive for heat exchange purposes since the majority of generated heat requiring heat dissipation and thermal transfer is obviously at body portion 22. Therefore, they only need to be of sufficient size to ably support heatsink 20 and easily adaptable to take up and absorb any warpage impose upon the heatsink due to thermal stress deflection. Thus, these fins 38 are not as rigid as fins 36 so that they are more able to absorb the thermal stresses developed within heatsink 20 because of its thermal mismatch with ceramic cooler 28.

Body portion 24 is formed between fin-containing body portions 22 and 26 and comprises the thickest body section of heatsink 20 due the provision of an integral, solid under-belly portion 34. Belly portion 34 is, however, optional, as illustrated relative to the alternate embodiment shown in FIG. 3A. The inclusion of belly portion 34 functions as a stiffening element to substantially eliminate the possibility of any bowing or bending of heatsink bulk body portion 20A. This thickened region of the heatsink maximizes rigidity of the heatsink between the fin support portions 22 and 26 to counter any tendency for longitudinal bowing or warpage of the type illustrated at 18 in FIG. 1.

While most of fins 36 of heatsink 20 are located in the rearward region of the heatsink where a substantial portion of the heatsinking is required, a small number of smaller fins 38 are located in the front portion of the heatsink primarily for support on cooler 28.

FIG. 3A shows an alternate embodiment for the heatsink 20 of FIG. 3. Heatsink 20' comprises a continuous, single leg structure 30' extending for a substantial length of the bottom surface of heatsink 20' comprising a plurality of legs 36 in the shape of elongated fins. Fins 36 may be all substantially the full width of heatsink 20' or may progressively vary in width along the heatsink bottom surface. As an example, the width of fins 36 may monotonically decrease in width from left to right of FIG. 3A, as those fins not in proximity to overlying semiconductor device 17 need not be as wide for any required thermal heat transfer purposes and, moreover, are rendered more mechanically flexible in nature for taking up and absorbing thermal stress deflections of heatsink 20'. While the embodiment of FIG. 3A provides good results, the embodiment of FIG. 3 provides for better results in the prevention of thermal stress deflection.

While the foregoing embodiments illustrate leg structures 30, 30' and 32 all shown integral to or part of the major undersurface of heatsink 20, 20', as would be evident to those skilled in the art, these leg structures could, alternatively, be either integral or associated with the undersurface, i.e., with the surface of cooler 28 or an independent group of legs held in spatial relation along opposite edges of the lengths of the legs by a pair of bar members. In either case, the ends of legs that are to be in contact with either the undersurface of heatsink 20, 20' or cooler surface 28 are fixed in contact to these surfaces by means of uniform layer of solder.

FIG. 5 illustrates the computer simulated thermal stress deflection effects on heatsink 20. When the entire unit or semiconductor system is raised in temperature by a uniform amount, the difference in thermal expansion between heatsink 20 and cooler 28 is absorbed by both leg structures 30, 32 in the form of fins 36 and 38, as clearly illustrated by the distorted profile of these legs illustrated in FIG. 5. Rear fins 36 are slight flexed and distorted and smaller size fins 38 are distorted more so since the coefficient of expansion for heatsink 20 is greater than that for cooler 28. Because fins 36, 38 are capable of compensating for the difference in thermal expansion of these materials, the bulk body portion 20A of heatsink 20 is not caused to distort or undergo thermal stress deflection and remains substantially planar, as indicated in FIG. 5. There is no visible deflection at the top surface of the heatsink because all of the stress deflection is absorbed by fins 36, 38 themselves, leaving the upper bulk body portion 20A of heatsink 20 free of any such stress. The rigidity of bulk body portion 20A is further strengthened by the presence of belly portion 34 resisting any flexure or longitudinal deformation of bulk body portion 20A of heatsink 20. As a result, the several electrical and optical components, such as elements 23, 25, 29, 32, 35, remain properly aligned with the output of semiconductor device 17 regardless of the particular operating power and temperature levels and, correspondingly, different levels or amounts of heat that may be thermally introduced by device 17 into heatsink 20.

Leg structures 30, 30' and 32 for heatsink 20 of this invention provide for thermal compensation, addressing three major issues present in prior comparable heatsink structures. First, as just alluded to the previous paragraph, different semiconductor devices 17 capable of generating and dissipating different levels and magnitudes of heat can be accommodated by the design of this single heatsink 20 since the flexure of legs 30, 32 is capable of mechanically absorbing various stress deflection loads regardless of difference in the amounts of heat capacities.

Second, to design a heatsink to compensate for a particular level of thermally induced stress is not a feasible approach because the degree of induced stress and warpage of the heatsink may change over time and, in fact, may substantially relieve itself in a period of time. Therefore, it is preferred that the heatsink be thermally self-compensating over a range of different thermal transfer conditions capable of preventing warpage or deflection of the major body portion of the heatsink.

Third, the employment of the leg structures 30, 32 provides a means for a high level of thermal transfer to the surface of cooler 28 without potentially destroying the cooler. Experience has demonstrated that, due the thermal mismatch, for example, between a copper block heatsink soldered to a ceramic cooler surface, breakup and destruction of the cooler structure can occur due to the thermal coefficient mismatch. However, with the leg structures 30, 32 taking up and absorbing the induced thermal stress due to the thermal mismatch, the possibility of this kind of destruction is substantially eliminated.

In certain applications involving treatment of outputs provided by semiconductor devices, it is necessary to ensure that there is no feedback of the output from the semiconductor device back to its source. An example of one such semiconductor device is a MOPA device which may be comprised of either a stable or unstable resonator providing a high power output beam from a facet that has very low reflectivity such as at or below 1%. Any feedback will therefore enter the output facet and undesirably change the wavelength or transverse mode. Examples of such devices are disclosed in U.S. Pat. No. 5,392,308, which patent is commonly owned by the assignee herein and is incorporated herein by reference thereto.

With reference to FIG. 2, alignment of the output from semiconductor device 17 is along alignment axis 39 so that if any of the components 23, 25, 29, 31 or, most particularly, the polished input end of optical fiber 35 provided any reflected feedback, this feedback may cause an undesirable change in operating wavelength. On manner of isolation of this feedback, or at least substantially reduce feedback in the type of lens system shown in FIG. 2 is to position the input end of optical fiber 35 at an angle relative to alignment axis 39. This can be simply accomplished by polishing the input end of the fiber to be at an angle relative to a plane perpendicular to the axis of the fiber. Thus, the planar extent of the input end of fiber 35 will be in a plane that this not perpendicular to alignment axis 39. As a result, any reflected portion of the beam produced from the semiconductor device source will be diverted away at an angle different from the direction of alignment axis 39 so as not to provide interfering feedback with the operation of the semiconductor device. This is effectively illustrated in FIG. 6 where optical fiber 40 comprises a cladding 42 and a core 44 with an input end 46 of fiber 40 polished or otherwise forming a plane along line 47 which is disposed at an angle, $\theta$, relative to a plane or line 45 perpendicular to axis 43 of fiber 40. Because of refraction at surface 46 of optical fiber 40, the central light cone of input beam on alignment axis 39 must be position at an angle, $\phi$, relative to axis 43 of fiber 40 for achieving acceptance of the beam into the fiber or, said another way, at an angle of $\theta+\phi$ extending from axis 41 which is perpendicular to the plane (represented by line 47) of input end surface 46.

While the problem of feedback is substantially eliminated by the solution shown on FIG. 6, other alignment problems are created. Maximum coupling efficiency into optical fiber 40 is more difficult to achieve since the axis 43 of the fiber is no longer in alignment with output beam axis 39 so that optical fiber 40 must also be rotated about its axis 43 to achieve the proper angular relation between input end or face 46 and beam axis 39, i.e., achieve the precise refraction angle of $\theta+\phi$ for coupling of the beam into the fiber input end surface 46. The optical arrangement shown in FIG. 7 provides a solution to this alignment difficulty.

In FIG. 7, a special fiber ferrule 33A has a cylindrical body and is designed so that optical fiber is inserted into aperture 54, which is set at the proper angle, $\theta+\phi$, relative to alignment or beam axis 39, which angle is represented by surface face 55 of ferrule 33A. After insertion of fiber 40 and fixing the same in position, input end surface 46 of fiber 40 may be polished to match the angular orientation of face 55. As a result, the rotational alignment of fiber 40 is no longer a further necessary consideration as long as the ferrule body or its axis 56 is substantially aligned parallel with the horizontal or z direction which is the same as axis 39. Lateral transverse alignment with respect to the x-y plane relative to the alignment direction of beam 39 as well as adjustment for the focal length of lens 31 along the z axis before ferrule 33A are then accomplished before finally fixing ferrule 33A into position. Thus, x-y-z alignment completes the necessary alignment and alignment by rotation of ferrule 33A about axis 56 is no longer necessary since the refraction angle, $\theta+\phi$, is pre-maintained by the ferrule itself.

Once ferrule 33A is fixed into position, additional fine alignment of beam 39 relative to input end surface 46 can be accomplished with the adjustment of steering lens 29. As previously indicated relative to FIG. 2, steering lens 29 provides a means for final positional adjustment of input beam 39 directly onto center point 58 of fiber 40. In practice, focusing lens 31 is initially set so that the lens axis is located as close as possible to point 58. Steering lens 29 provides for final alignment correction of beam 39 after focus lens 31 has been mounted and fixed in position to at least a location close to center point 58. Thus, steering lens 29 may be moved laterally or transversely in the x-y plane of FIG. 7, as indicated in part by arrow 50, to bring the focus point of light beam 39 into final alignment with point 58 in input end surface 46. The sensitivity between such lateral or transverse alignment of lens 29 relative to the focal point of output beam 39 may be, for example, about a 10:1 ratio. This lateral, transitional adjustment can be accomplished by movement either in the x or y direction or a combination of both directions.

Even though the positional alignment may have been achieved, there may be additional optical coupling losses because the axis of output beam 39 may be angularly offset from the optimum input angle for fiber 40. This offset can be corrected to align beam 39 at the proper input angle relative to the fiber input end surface 46 by rotational alignment of steering lens 29 about the x and/or y axis, as indicate in part by arrow 52, to bring the angle of beam 39 into the proper input angle for optimum coupling efficiency. An example of such rotational adjustment of steering lens 29 is shown in FIG. 7 by rotation of steering lens 29 about the x axis from position 29A to position 29B to correct for such angular offset. As a result, output beam 39 is changed from a misaligned angular position 39M to a corrected angular position 39C as illustrated in FIG. 7. This adjustment can be accomplished by rotational movement of steering lens 29 about either the x axis or the y axis or a combination of both rotational axis. Lens 29 is then fixed in its finally adjusted position of corrected transitional and rotational adjustment providing for maximum coupling efficiency into fiber 40.

In practice, the output end (not shown) of optical fiber 40 can be monitored as to optimum intensity indicative of the adjustment of steering lens 29 being translated or rotated to provide maximum coupling efficiency to fiber core 44.

While the foregoing description relates to the input of an output beam optically coupled specifically to an optical fiber, it should be understood that the coupled device can be any other kind of optical transmission medium in lieu of an optical fiber, for example, a nonlinear crystal waveguide, optical waveguide device, optical amplifier, optical filter, optical upconversion system, tunable Raman or Brillouin laser system, or a polarization maintaining fiber system.

Although the invention has been described in conjunction with one or more preferred embodiments, it will be apparent to those skilled in the art that other alternatives, variations and modifications will be apparent in light of the foregoing description as being within the spirit and scope of the invention. Thus, the invention described herein is intended to embrace all such alternatives, variations and modifications that are within the spirit and scope of the following claims.

What is claimed is:

1. An optical system for coupling an output beam in an alignment direction from a semiconductor device through a lens arrangement to focus the output beam onto a center point of an input end surface of an optical transmission medium comprising:

a focusing lens positioned between said device and said optical transmission medium to receive said output beam for focusing said beam to said center point, a steering lens position between said device and said focusing lens with its center in relative axial alignment with said output beam, said optical transmission medium input end surface polished at an angle, $\theta$, relative to the alignment direction of the output beam to prevent any reflected feedback return from said medium along the beam alignment direction back to said semiconductor device, means for supporting said optical transmission medium input end at an angle, $\phi$, relative to the alignment direction of the output beam to provide for an acceptance of the input beam into said angled input end surface such that the resulting angular relationship of an optical axis of said optical transmission medium relative to the alignment direction of the output beam is $\theta+\phi$, said steering lens translated about an axis transverse to the alignment direction of said output beam relative to both said focusing lens and said support means, after said focusing lens and said support means have been fixed in alignment position, to finally align the focused point of the beam, via said fixed focusing lens, to said center point.

2. The optical system of claim 1 which includes an astigmatic correcting lens system for the output beam.

3. The optical system of claim 1 wherein said optical transmission medium is an optical fiber.

4. The optical system of claim 1 wherein said semiconductor device is a stable or unstable resonator having a resonator portion with a lateral dimension which is larger at its output than some other portion of the resonator.

5. The optical system of claim 1 further comprising a steering lens positioned between said semiconductor device and said focusing lens within relative alignment with the alignment direction of the output beam, said steering lens translated in at least one direction transverse to the alignment direction of the output beam for aligning the focused point of said beam in close proximity to said center point of said input end surface via said focusing lens.

6. The optical system of claim 5 wherein said steering lens is rotated about at least one orthogonal axis in a plane transverse to the alignment direction of the output beam to change the angular relationship of the output beam relative to said input end surface via said focusing lens to achieve maximum optical coupling of the output beam into said optical transmission medium.

7. The optical system of claim 6 wherein said supporting means is a cylindrically shaped ferrule.

8. The optical system of claim 6 wherein said transmission medium is an optical fiber.

9. The optical system of claim 1 wherein said semiconductor device is a stable or unstable resonator having a resonator portion with a lateral dimension which is larger at its output than some other portion of the resonator.

10. The system of claim 1 wherein said optical transmission medium comprises an optical fiber, a nonlinear crystal waveguide, optical waveguide device, optical amplifier, optical filter, optical upconversion system, tunable Raman or Brillouin laser system, or a polarization maintaining fiber system.

11. The method of alignment of an output beam from a semiconductor device onto a center point of an angled input end surface of an optical transmission medium employing an optical system that includes a steering lens and a focusing lens aligned along an alignment direction of the output beam between the semiconductor device and the optical transmission medium, comprising the steps of:

fixing the optical transmission medium input end at an angle transverse with respect to the output beam alignment direction to prevent any portion of the output beam from being reflected from the optical transmission medium back along the output beam alignment direction while maximizing output beam input into the optical transmission medium in satisfying beam diffraction requirements of the angled input end of the optical transmission medium, aligning the focusing lens so that the focal point of the output beam is positioned on the optical transmission medium input end surface, fixing the position of the focusing lens as aligned, adjusting the orientational position of the steering lens relative to the output beam alignment direction until the focal point of the output beam is positioned on the medium input end surface center point for achieving maximum optical coupling of the output beam into the optical transmission medium, and thereafter fixing the position of the steering lens as adjusted.

12. The method of claim 11 wherein the step of adjusting consists of the step of translating the position of the steering lens in a direction transverse to the output beam alignment direction until the focal point of the output beam is positioned on the medium input end surface center point.

13. The method of claim 12 including the further steps of operating said semiconductor device to produce a beam output, and monitoring an output of the optical transmission medium while translating the position of the steering lens until the optical transmission medium output is of optimum intensity.

14. The method of claim 13 wherein said optical transmission medium is an optical fiber.

15. The method of claim 11 wherein the step of adjusting consists of the step of rotating the steering lens about an axis in a plane transverse to the output beam alignment direction to change the angle of entrance of the output beam relative to the input end surface of the optical transmission medium.

16. The method of claim 15 including the further steps of operating said semiconductor device to produce a beam output, and monitoring an output of the optical transmission medium while rotating the steering lens until the optical transmission medium output is of optimum intensity.

17. The method of claim 16 wherein said optical transmission medium is an optical fiber.

* * * * *